United States Patent
Ben-Michael

(10) Patent No.: US 12,300,757 B2
(45) Date of Patent: May 13, 2025

(54) HIGH-SENSITIVITY AVALANCHE PHOTODETECTORS

(71) Applicant: Amplification Technologies, Corp., Linden, NJ (US)

(72) Inventor: Rafael Ben-Michael, Scotch Plains, NJ (US)

(73) Assignee: Amplification Technologies, Corp., Linden, NJ (US)

( * ) Notice: Subject to any disclaimer, the term of this patent is extended or adjusted under 35 U.S.C. 154(b) by 0 days.

(21) Appl. No.: 18/777,478

(22) Filed: Jul. 18, 2024

(65) Prior Publication Data

US 2025/0072127 A1    Feb. 27, 2025

Related U.S. Application Data

(63) Continuation of application No. 18/237,776, filed on Aug. 24, 2023, now Pat. No. 12,074,243.

(51) Int. Cl.
| | |
|---|---|
| H01L 31/107 | (2006.01) |
| H01L 31/0216 | (2014.01) |
| H01L 31/0304 | (2006.01) |
| H01L 31/18 | (2006.01) |

(52) U.S. Cl.
CPC .... *H01L 31/1075* (2013.01); *H01L 31/02162* (2013.01); *H01L 31/03046* (2013.01); *H01L 31/1844* (2013.01); *H01L 31/1852* (2013.01); *H01L 31/1876* (2013.01)

(58) Field of Classification Search
CPC .......... H01L 31/1075; H01L 31/02162; H01L 31/03046; H01L 31/1844; H01L 31/1852; H01L 31/1876
See application file for complete search history.

(56) References Cited

U.S. PATENT DOCUMENTS

| | | | | |
|---|---|---|---|---|
| 6,031,250 A | * | 2/2000 | Brandes | H01L 31/03765 257/E31.049 |
| 8,441,032 B2 | * | 5/2013 | Linga | H01L 31/1075 257/589 |
| 2002/0040983 A1 | * | 4/2002 | Fitzergald | H01L 27/14634 257/E27.111 |
| 2002/0113282 A1 | * | 8/2002 | Yoneda | H01L 31/105 257/E31.128 |
| 2009/0242932 A1 | * | 10/2009 | Luryi | H01L 31/022408 257/E31.119 |

* cited by examiner

*Primary Examiner* — Sitaramarao S Yechuri
(74) *Attorney, Agent, or Firm* — Franklin Schellenberg

(57) ABSTRACT

Disclosed herein are avalanche photodiodes (APDs) particularly useful for high-sensitivity Geiger-mode APDs formed using an array of micro-cells. The photodetector is formed on a semiconductor substrate of indium phosphide (InP) having epitaxial layers, including indium gallium arsenide (InGaAs) as the photodetecting layer, with n-doped InP to one side, and layers of InP incorporating p-doped regions on the opposite side. The p-doped regions may serve to define an array of micro-cells, which may be arranged in a hexagonal pattern. A well may be etched through the epitaxial structures, allowing an electrode that contacts the n-doped InP layer and another that contacts the p-doped InP regions to be patterned on the same side of the detector. Flip-chip bonding techniques can then attach the semiconductor wafer to a stronger support substrate, which may additionally be configured with electronic circuitry positioned to electrically contact the electrodes on the semiconductor wafer surface.

20 Claims, 14 Drawing Sheets

Reproduced from FIG. 1
of US 8,441,032

HIGH-SENSITIVITY AVALANCHE PHOTODETECTORS

PRIORITY

This patent application is a continuation of pending U.S. patent application Ser. No. 18/237,776, entitled METHOD FOR FABRICATING HIGH-SENSITIVITY PHOTODETECTORS, filed on Aug. 24, 2023 and which is hereby incorporated herein by reference in its entirety.

RELATED APPLICATIONS

This patent application is related to the following commonly owned U.S. patents, all of which are hereby incorporated herein by reference for all purposes in their entirety: U.S. Pat. No. 6,885,827, issued on Apr. 26, 2005, and entitled "HIGH SENSITIVITY, HIGH RESOLUTION DETECTION OF SIGNALS," U.S. Pat. No. 7,085,502, issued on Aug. 1, 2006, and entitled "HIGH SENSITIVITY, HIGH RESOLUTION DETECTION OF SIGNALS," U.S. Pat. No. 7,899,339, issued on Mar. 1, 2011 and entitled "HIGH SENSITIVITY, HIGH RESOLUTION DETECTION DEVICES AND ARRAYS," U.S. Pat. No. 8,275,270, issued on Sep. 25, 2012 and entitled "HIGH SENSITIVITY, HIGH RESOLUTION DETECTION DEVICES AND ARRAYS," and U.S. Pat. No. 8,441,032, issued on May 14, 2013 and entitled "LOW-LEVEL SIGNAL DETECTION BY SEMICONDUCTOR AVALANCHE AMPLIFICATION."

FIELD OF THE INVENTION

The technology disclosed in this Application relates to the fabrication and packaging of avalanche photodiodes, and in particular for photodetectors requiring high sensitivity for use in low light or for single photon detection.

BACKGROUND

Semiconductor photodetectors capable of detecting low intensity photons are important for applications such as lidar systems that are designed for the automotive and surveying industries. In lidar systems, laser light, often pulsed, is directed towards a remote object or scene, and the reflected or scattered light returning to the source is detected and analyzed. However, the distances from source to object and then back to the detector can be long, on the order of kilometers. The number of backscattered or reflected photons that return to the detector can be very vastly attenuated, sometimes only a single photon per laser pulse.

High-sensitivity photodetectors that allow these small, and sometimes single photon, levels of photointensity to be accurately detected and analyzed enable improved lidar systems to be developed, with benefits such as an increased range and an ability to discern more information about the reflecting object.

Semiconductor avalanche photodiodes allow a photoelectron produced by the absorption of a photon to be amplified, increasing a detection current from a few photoelectrons to thousands of electrons. If the operating conditions for the avalanche photodiode are properly set, the current produced is proportional to the photointensity, while being far more easily and reliably measured.

Avalanche photodiodes have been in use for many decades. However, to improve sensitivity and accuracy, a photodetector architecture that divides the photosensitive area into multiple photocells can be advantageous. Each cell may be capable of detecting small numbers of photons, while avoiding saturation problems in the device as a whole. The signals from the multiple photocells can then be combined to form a single photocurrent as the output of the detector.

However, in such an architecture, providing a bias voltage across the device requires an electrode be attached to both sides of the device. To provide mechanical stability, thicker substrates and layers may be desired, but this can cause thicker layers of material between the photosensitive cells and the incoming photons, potentially attenuating the already weak signals further.

There is therefore a need for a packaging architecture for a photodetector containing sensitive, multi-cell avalanche photodiodes that enables both increased sensitivity and mechanical stability and integrity.

BRIEF SUMMARY

This Application discloses methods for fabricating and packaging a photodetector comprising avalanche photodiodes, and in particular Geiger-mode avalanche photodiodes formed using an array of micro-cells for photodetection.

In some embodiments, the photodetecting regions are formed using a semiconductor wafer having various epitaxial layers deposited onto an indium phosphide (InP) substrate. The epitaxial layers may include a photo-absorbing layer of a material such as indium gallium arsenide (InGaAs), with an n-doped layer of indium phosphide (n-doped InP) to one side of the photo-absorbing layer, and layers of InP that incorporate p-doped regions of InP (p-doped InP) on the opposite side. A bias voltage can be applied across the layers using electrodes connected to the n-doped and p-doped regions, so that, when a photon is absorbed and a photoelectron generated, the high electric field from the bias voltage allows the photoelectrons to be amplified into a current of electrons.

In some embodiments, the photodetecting regions are formed as a group of micro-cells, with each cell defined by the p-doped regions of InP. The array of photocells may be formed in a hexagonal array, with spacing between the centers of the cells on the order of 1 to 15 μm, and an overall lateral dimension for the array as large as 300 μm. These micro-cells can act as independent photodetectors, with their currents summed at the output. In some embodiments, a micro-cell may additionally comprise a resistive/capacitive structure, to aid in quenching the cell after a photodetecting event has occurred.

Once the photodetecting regions are formed, a well is etched into the epitaxial structure on the semiconductor wafer to remove portions of the epitaxial layers so that the well extends from a first surface of the wafer to the n-doped InP layer. This exposes the n-doped InP layer, allowing electrical contact to be made. Electrodes that apply bias voltage to the device may therefore can be patterned to have contact structures placed on the same surface of the semiconductor wafer, with the electrode contacting the p-doped regions being on that surface, while the electrode contacting the n-doped regions extends from that surface through the well to the n-doped InP region below.

With this architecture for single-side electrical contact, structures, flip-chip bonding techniques can then be applied to invert the semiconductor wafer and attach it to a stronger support substrate. This substrate may additionally be configured with electronic circuit structures positioned to electrically contact with the electrodes on the semiconductor wafer surface. The support structure itself may also be a semiconductor material, such as a silicon wafer, and have pre-fabricated circuit structures to connect to and process signals from the photodetector.

With the semiconductor wafer mechanically bonded to a sturdy support structure, the original substrate layers of the semiconductor wafer can be thinned and removed, thinning the semiconductor wafer to expose the n-doped InP layer. This allows the photosensitive region of the photodetector to have minimal material between it and the arriving photons. This increases the ability to detect low fluxes of photons, since the material that might deflect or absorb arriving photons has been reduced. Depositing an anti-reflective coating onto the exposed n-doped InP layer may also effectively increase sensitivity, as photons that might be lost to reflection are reduced.

A semiconductor wafer may be processed to include multiple regions with photodiode structures, and the wafer with the multiple structures can then be attached to a single support substrate using flip-chip bonding. This can allow multiple devices to be fabricated in parallel. The devices once bonded to the support substrate may then be separated using conventional dicing techniques.

DETAILED DESCRIPTION

Figure 1:
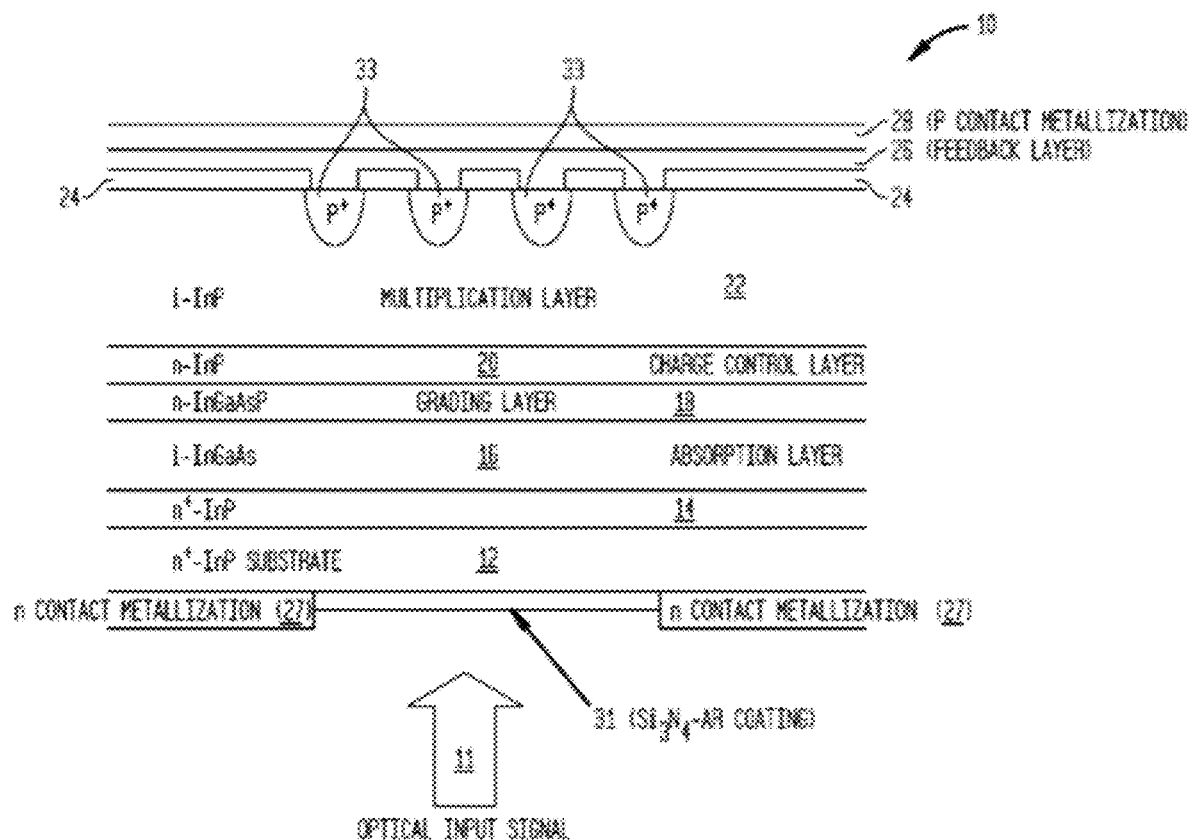
FIG. 1 illustrates a schematic in cross section of an example of an avalanche photodiode architecture originally presented in FIG. 1 of U.S. Pat. No. 8,441,032.

I. Avalanche Photodiode Fabrication.

Avalanche photodiodes (APDs) have been in use since the 1950s, and many designs and architectures have been offered as products for a variety of photodetecting applications. One approach involves using hetrostructure diodes, having a layer of InGaAs between layers of n-doped InP and p-doped InP. InGaAs can be photosensitive to infrared wavelengths including the 1.55 µm wavelength lasers commonly used in optical communications and many lidar implementations, while InP is transparent at these wavelengths, making this structure highly useful. InP is a well-known semiconductor material, available commercially as wafers, and doping and the deposition of epitaxial layers onto InP substrates are well-known processes. Various proportions of In and Ga may be used to allow lattice matching of InGaAs layers to the lattice constant of the InP layers (typically 5.868 Å), to avoid mechanical stresses when fabricated in epitaxially grown layers. At room temperature and normal atmospheric conditions, $In_{0.53}Ga_{0.47}As$ is a composition that is lattice matched to InP, and typically has a band gap energy of 0.75 eV corresponding to an absorption band edge of 1.65 µm, meaning higher energy 1.55 µm photons are well absorbed.

For highly sensitive APDs that transform a single elementary charge
 (a carrier, such as a single electron or hole) into a packet of many carriers (electronic charges), a process of impact ionization avalanche amplification can be employed, in which a high electric field (typically ~105 V/cm) causes an avalanche of carriers in the semiconductor material, which in turn allows for the detection of the avalanche-originating single charge by means of subsequent conventional electronic amplification.

This method becomes sensitive enough to detect single-photons in the so-called "Geiger Mode". In Geiger Mode (GM) operation, the APD is reverse-biased beyond the breakdown voltage. A GM-APD can remain in this meta-stable, so called "armed," state until a free carrier is generated and enters the depletion region. A free carrier can be generated by absorbing an incident photon, or by so called "dark" semiconductor processes that generate photons thermally, such as Shockley-Read-Hall (SRH), recombination-generation center, or by bulk diffusion of minority carriers from neutral regions, as well as other thermally activated physical and radiative recombination processes. In the depletion region of the avalanche photodiode, the free carrier drifts into the avalanche region, where it is accelerated by the high internal electric field, and acquires sufficient energy to produce a self-sustaining breakdown of the active area by the process of impact ionization.

This process produces a sustained avalanche-generated current. However, in order for the GM-APD to detect a new photon-generated event, it needs to be reset, or "re-armed." Re-arming the photon detector is achieved by lowering the bias that is applied to the avalanche region to below the breakdown bias, an action that terminates the avalanche. Lowering the bias is achieved by a process called "active quenching," in which the external bias is reduced ("quenched") below the breakdown level, using an external decision-making circuit that detects an event and then reduces the bias momentarily, after which the bias is raised again above the breakdown level to "re-arm" the GM-APD.

Practically, the burst of high current transient, which is the outcome of this process, is used to electronically detect an "event." However, this process cannot discern between a packet of photons or a single photon, as the avalanche current that is generated in either case is the same: once the avalanche is started, the only way to terminate it is by lowering the electric field, so the number of photons absorbed during this process is not relevant, as long as at least one free carrier managed to start an avalanche. A photon detector that operates that way is called a Single Photon Avalanche Detector (SPAD). A detected "event" reflects that at least one photon was detected, even if more than one photon has arrived simultaneously or just immediately after the avalanche process has started.

In addition to this active quenching approach, there is a passive way of momentarily reducing the bias, called "passive quenching." In passive quenching, a resistor may be connected in series with the avalanche junction. Once an event occurs, it generates a charge packet, which flows through the series resistor. This charge flow is an electrical current flow, and it reduces the voltage drop on the resistor according to Ohm's law (V=IR, where V is the voltage, I the current and R the resistance of the series resistor).

This transient voltage reduction acts as negative feedback to the current flow. Effectively, the negative feedback caused by the resistance of the resistor reduces the bias on the avalanche region of the photodiode momentarily, and in doing so, "re-arms" the GM-APD. The value of this resistance should be high enough to generate a few volts of transient voltage drop, to reduce the bias from the overbias to a level below the breakdown voltage.

Architectures may be implemented in which the resistor is placed to the side of the micro-cell. This design can be compatible with many established CMOS processes, and is in some cases easier. However, side-deployed resistors tend to take up area that may otherwise be used for photodetection, and therefore the overall detection area is reduced, and the device as a whole can have lower sensitivity.

A GM-APD, as described above, either quenched actively or passively, cannot discern between one-photon and multi-photon events. Although it is called a "Single Photon Avalanche Detector (SPAD)" because it is capable of detecting single photon events, "single" in this case actually means "at least one" photon event was detected. It can also detect multi-photon events, but the output will be similar to the output of a single-photon event.

A different type of enhancement to the GM-APD is a multi-photon detector, which can detect a single photon and distinguish them from multi-photon events. The operating concept of these types of multi-photon detectors is to use the passive-quenching approach along with multitude of combined channels, which are then combined to add their currents into a single output.

The photosensitive area of such a detector has many parallel channels. Since the characteristic dimension of these channels is typically on the order of a few micrometers (μm), they can be referred to as "micro-cells." By combining several micro-cells into one photo-detector, effectively each micro-cell acts alone in terms of event detection and re-arming of the cell, with the adjacent micro-cells independently detecting only photoevents that occur within those cells. As the outputs of all the micro-cells are summed together, the currents from multiple events taking place in separate micro-cells are combined, leading to a larger signal from distributed multi-photon events than from a single-photon event.

In this multi-channel micro-cell architecture, the resistive structure mentioned above may be deposited directly on the p-doped InP material of each micro-cell. Although this entails an additional fabrication step to place resistive material on the cells, the patterning can be formed with the same masking material used to define the micro-cells themselves, and is therefore does not represent significant additional complexity, while allowing a much larger area to be utilized for photodetection.

Such APDs have been described before, including in the patents cited and incorporated by reference above. FIG. 1 reproduces a cross-section view of a multi-cell photodetector device as presented in FIG. 1 of U.S. Pat. No. 8,441,032, owned by the same assignee of the present application, and incorporated by reference into this disclosure in its entirety.

The reference numbers as illustrated in the reproduced figure as shown in

FIG. 1 are: 10: a discrete amplification photodetector device; 11: Optical Input Signal (i.e. the photons to be detected); 12: an n-type InP ("n-InP") substrate; 14: an n-InP buffer layer, 16: an InGaAs layer; 18: a quaternary InGaAsP grading layer; 20: a n-InP charge control layer; 22: a nominally intrinsic InP multiplication layer, 33: heavily doped p-type (p+) regions within InP layer 22; 24: a dielectric layer (which may act as a surface passivation layer); 26: a feedback layer (providing the resistive function mentioned above, and which may include silicon nitride, silicon carbide, silicon oxide, silicon oxycarbide (SiOC), or silicon oxynitride (SiON), as well as other composite dielectric layers), and 28 a p-contact metallization layer. The surface may be coated with 31: an anti-reflective coating (e.g., silicon nitride), and the electrical contacts are 27: n-contact metallization and 28: p-contact metallization.

The reproduced figure in FIG. 1 is one example of the structure for a multi-cell avalanche photodetector; others are also found in the previous patents and publications listed above that are incorporated by reference in this application.

For the device as illustrated in figure reproduced in FIG. 1, the avalanche section is formed with a diffusion technique. The diffused element into InP is an acceptor, in order for the diffused area to become a p-type semiconductor. The element used is usually zinc, but any element that will turn the InP into a p-type semiconductor may be used, such as magnesium, carbon or cadmium. The avalanche gain is obtained by a conventional field-reducing technique with a thin layer of n-type donor dopant, such as silicon, tellurium, or any element that will modify the InP semiconductor to become n-type. This thin n-type doped layer of InP reduces the electric field that generates the avalanche in the multiplication layers to a low enough level in the absorber, which prevents an avalanche from occurring in the absorber layers.

The resistive material, or "feedback layer," is deposited on top of the avalanche-generating region. This layer functions as the resistive-capacitive element, which, when a charge from the avalanche is flowing through it, reduces the bias according to Ohm's Law. Examples for this layer material can be any number of carbide-metal alloys. The resistivity of the layer can be modulated with the inclusion of a metal into the alloy, such as selenium, antimony, or tellurium and the like.

Forming the micro-cell is done by using conventional diffusion techniques for the regional deposition of p-dopants into the InP, and then depositing the resistive material.

To allow contact to the micro-cells as illustrated in FIG. 1, metallizations (n-contacts 27 and p-contacts 28) are provided on opposite sides of the photodetector wafer, and allow the voltage bias to be applied. Normal electrical contacts are therefore applied to the two opposite sides of the wafer.

The side where photons 11 enter the photodetector (through the silicon nitride antireflection layer 31 into the n-InP layer 12) must be exposed to the incoming photons 11. However, creating a wafer with one side as the n-InP and the other the p-InP metallization on the backside produces a wafer that can be thin and fragile.

II. Photodetector Packaging

The fabrication and packaging technology disclosed herein address this problem by first fabricating the avalanche photodiode on a semiconductor wafer containing InP, and then using flip-chip bonding techniques to allow support by a thicker, more mechanically sturdy support substrate, such as a ceramic or silicon wafer. Electrical contact with both sides of the avalanche photodiode can be made from a single surface of the support substrate by etching and coating a contact well into the semiconductor wafer. This allows electrical contact structures for the electrodes to be formed on the same surface of the wafer, with one electrode contacting the n-InP layer through the contact well, while another electrode contacts the p-InP region.

The avalanche sensitivity is improved if the photodetecting region is divided into a plurality of micro-cells. Some fabrication techniques for fabricating micro-cells have been described in the patents incorporated by reference above. The micro-cells may typically be a few micrometers in diameter, and typically spaced 5-15 µm apart. Small numbers of photons may still saturate a single cell if they happen to all impinge on that cell, but with a low photon density, the photon count for each cell will tend to be low, and the likelihood of any cell saturating becomes significantly smaller.

Figure 2A:
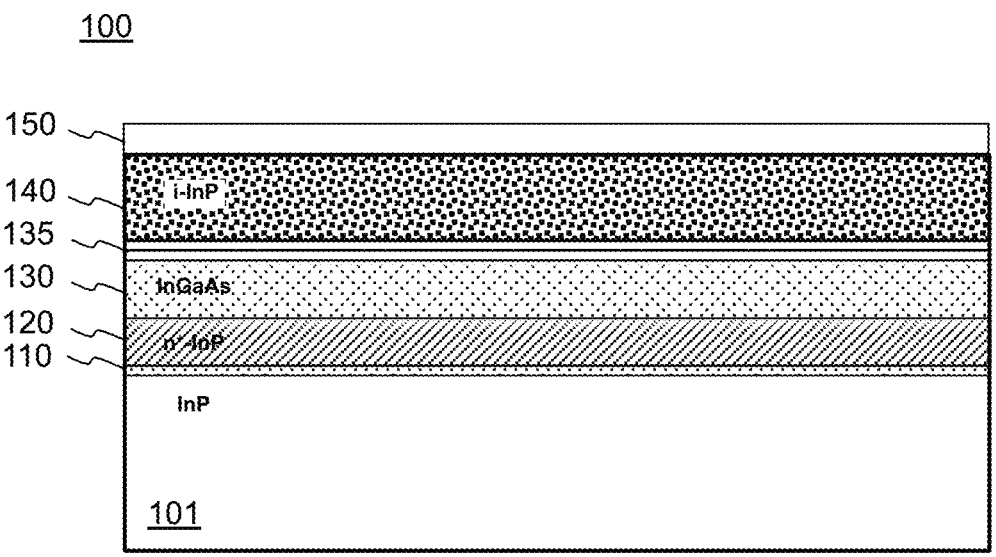
FIGS. 2A-2B illustrate a schematic in cross-section showing the preparation of an epitaxial semiconductor wafer for the fabrication of avalanche photodiodes according to some embodiments of the invention.
Figure 2B:
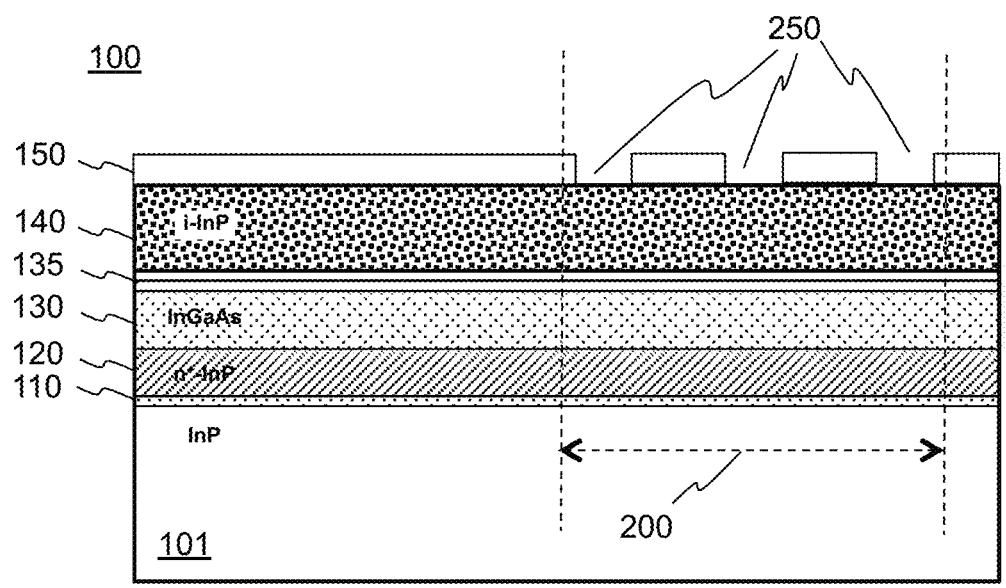
Figure 3:
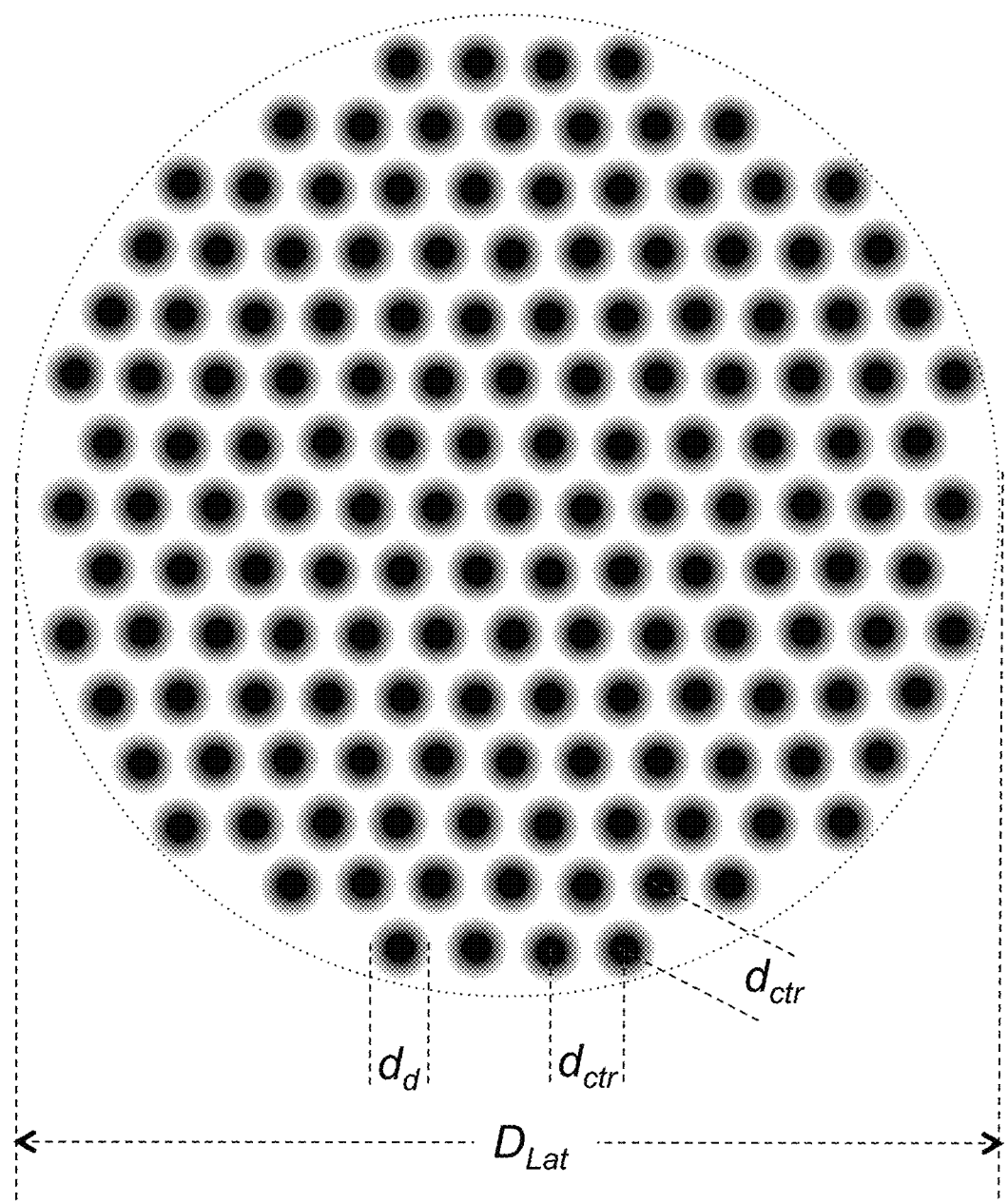
FIG. 3 illustrates a hexagonal pattern as may be used for micro-cell formation according to some embodiments of the invention.
Figure 4A:
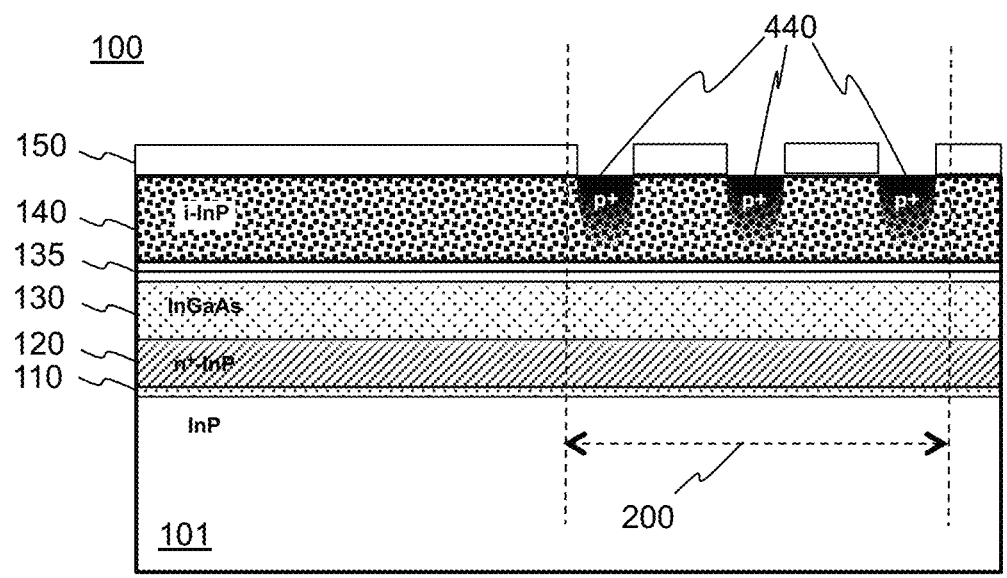
FIGS. 4A-4C illustrate a schematic in cross-section showing the preparation of micro-cells for the fabrication of avalanche photodiodes according to some embodiments of the invention.
Figure 4B:
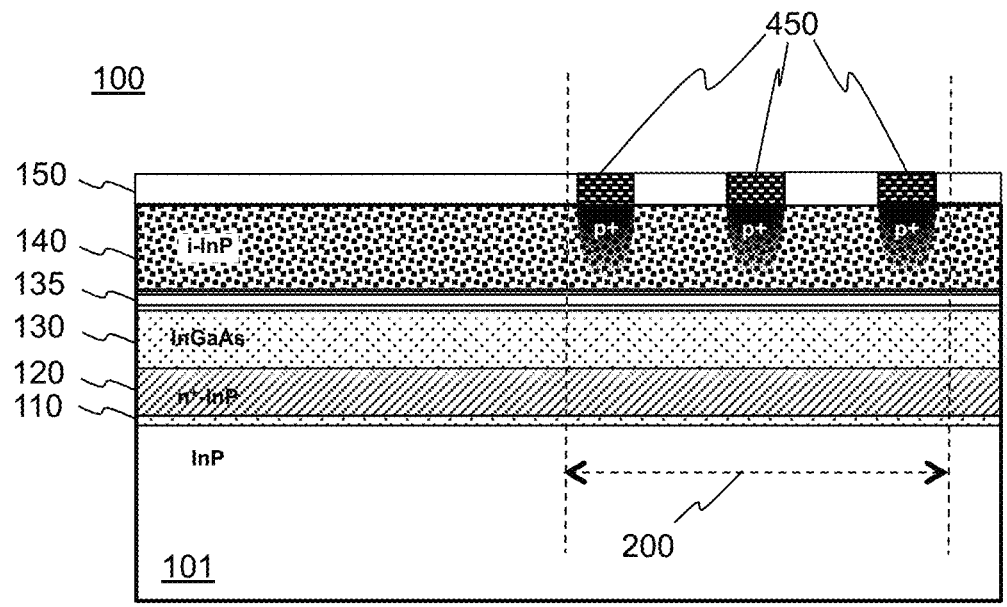
Figure 4C:
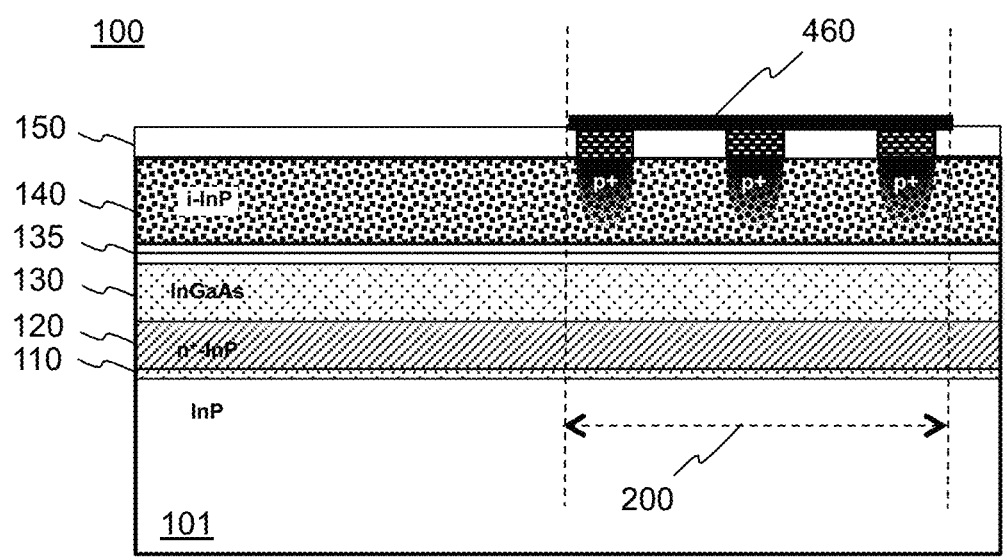
Figure 5A:
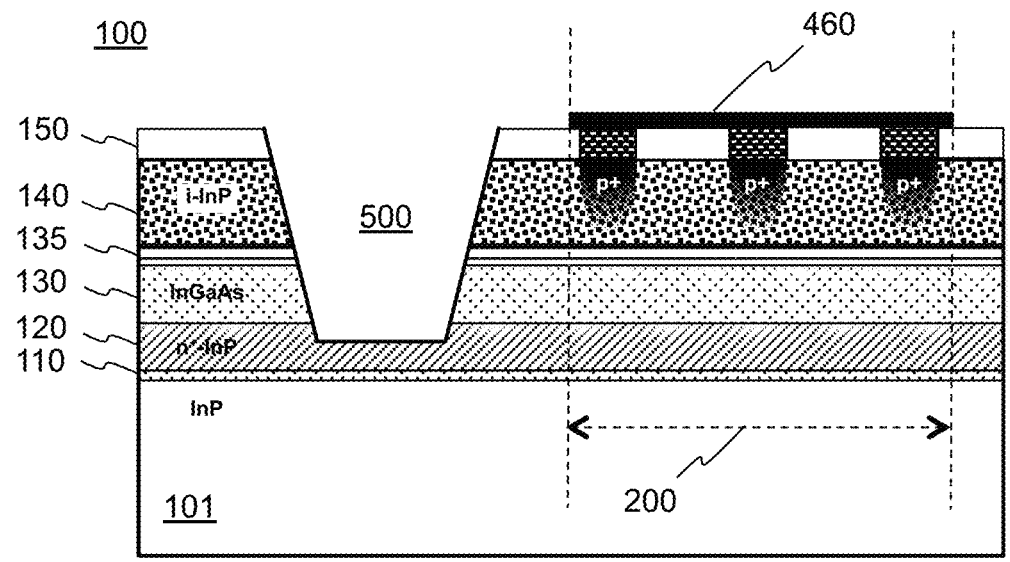
FIGS. 5A-5B illustrate a schematic in cross-section showing the preparation of n-wells for electrical contact for avalanche photodiodes according to some embodiments of the invention.
Figure 5B:
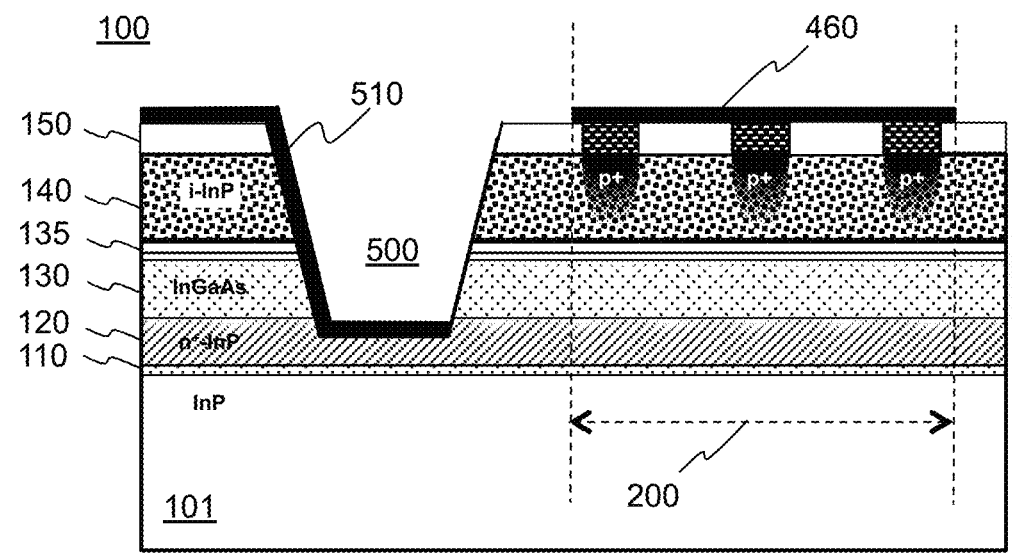

FIGS. 2A-2B illustrate exemplary process steps for processing an InP semiconductor wafer in preparation for forming micro-cells. FIG. 3 illustrates an example of a possible layout for forming micro-cells. FIGS. 4A-4C illustrate an exemplary process for forming micro-cells for an avalanche photodiode. FIGS. 5A-5B illustrate an exemplary process for forming a well to electrically contact the n-InP layer.

Figure 6A:
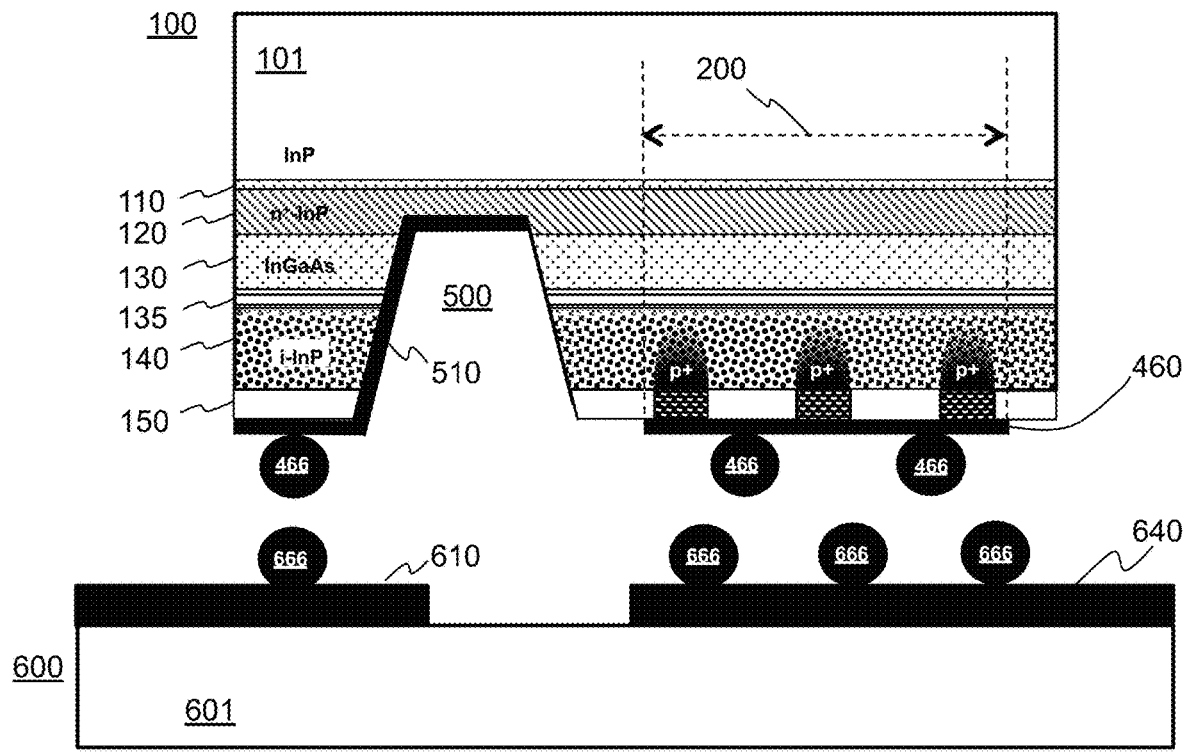
FIGS. 6A-6B illustrate a schematic in cross-section showing the electrical bonding of a semiconductor wafer comprising n-wells and avalanche photodiode structures to a support substrate according to some embodiments of the invention.
Figure 6B:
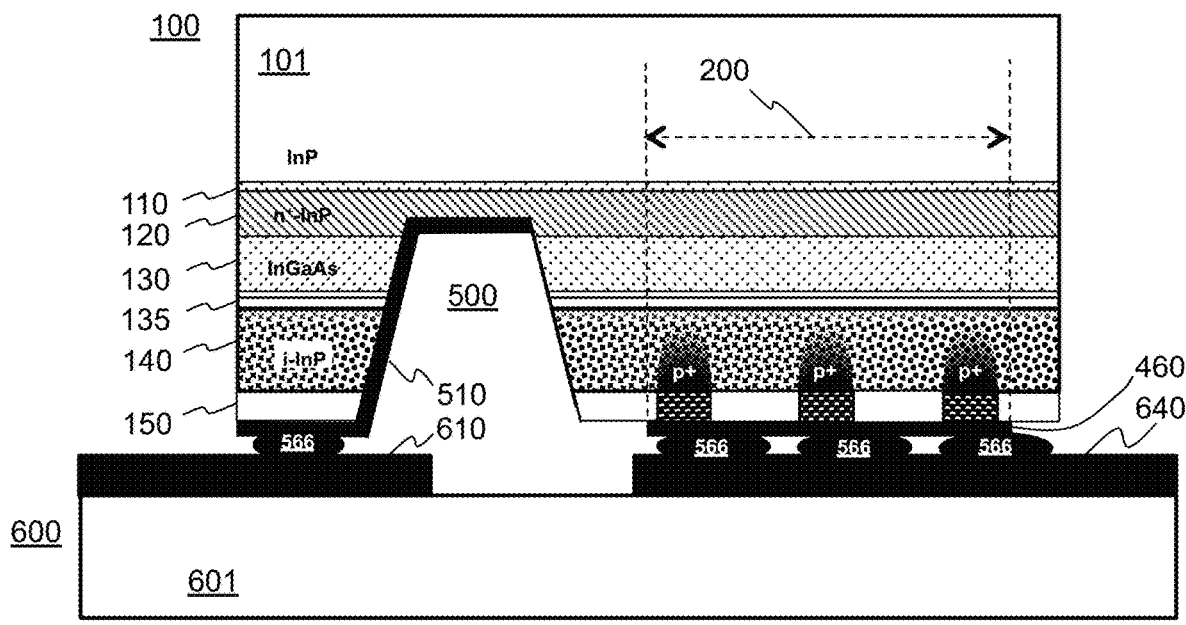

FIGS. 6A-6B illustrate an exemplary process for bonding to a support substrate.

Figure 7A:
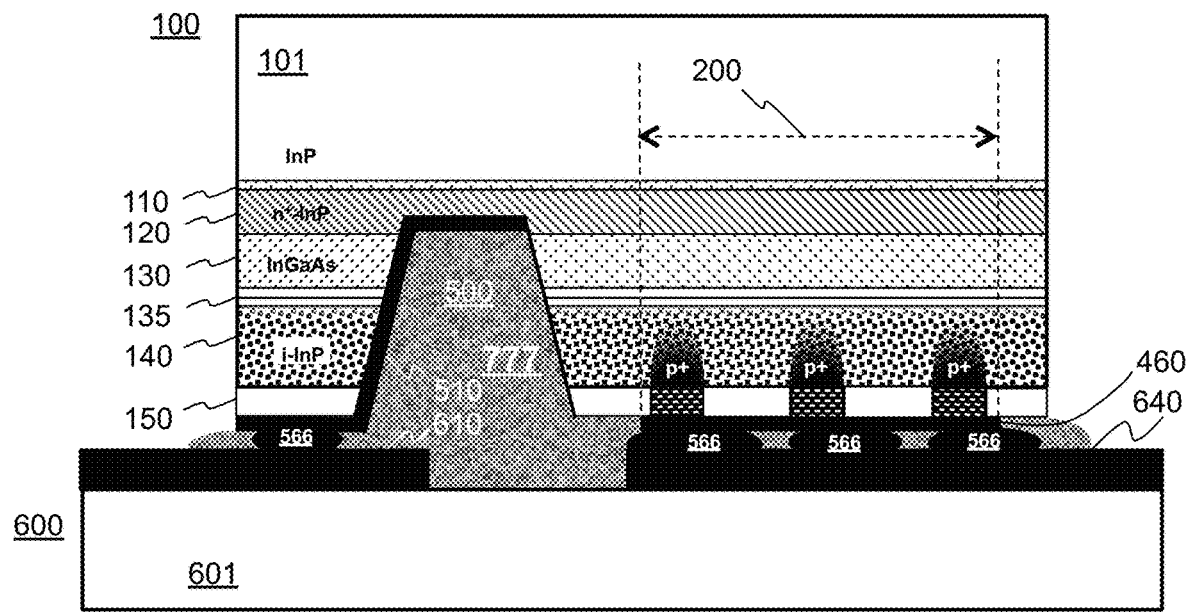
FIGS. 7A-7D illustrate a schematic in cross-section showing epoxy bonding and the removal of back layers for the fabrication of avalanche photodiodes according to some embodiments of the invention.

FIGS. 7A-7D illustrate examples of additional fabrication steps once the wafer and substrate are bonded. FIGS. 8A-8B illustrate an example of a fabricated device being connected and in use for detecting photons.

FIG. 2A illustrates a cross section of exemplary InP wafer 100. A typical InP wafer will be 4 inches in diameter, and the wafer may comprise several layers of epitaxially or otherwise deposited material. The wafer may have an InP base 101, typically between 350 to 600 µm thick, a thin layer of material (e.g. InGaAs), typically 250 nm thick, that serves as an etch stop layer 110 during subsequent processing, and an n-doped InP layer 120, which may be between approximately 1 µm thick, that will serve as the cathode for the photodetector.

On top of the n-doped InP layer 120, additional layers for the formation of avalanche photodiodes may be deposited. These include a layer 130 that serves as the photon absorber, such as layer of InGaAs (e.g. $In_{0.53}Ga_{0.47}As$), which may typically be 1.5 µm thick. Above that, additional transition layers 135 may be deposited. These transition layers 135 may comprise an intermediate layer of InGaAsP, sometimes called a "grading layer", typically 250 nm thick, to allow lattice matching between the InGaAs and the InP layers, and also an n-doped InP layer, typically 250 nm thick.

This thin n-type doped layer of InP in the transition layers 135 reduces the electric field that generates the avalanche in the multiplication layers to a low enough level in the absorber, which prevents an avalanche from occurring in the unwanted absorber layers. In some embodiments, an n-type donor dopant, such as silicon, tellurium, or any element that will modify the InP semiconductor to become n-type, is diffused into the InP to form the n-doped portion of transition layers 135. The doping level and thickness may be mutually varied to achieve the desired field reduction.

Above that, an additional layer of InP 140, typically about 2 µm thick, can be deposited, which is initially not deliberately doped, but will be subsequently doped in selective regions to form p-doped regions for the micro-cells. The wafer may then be capped with a dielectric coating layer 150, typically silicon nitride ($Si_3N_4$).

In FIG. 2B, a portion of the wafer 100 is identified as a region 200 for forming an avalanche photodiode. Although the illustration only shows a single photodiode region 200 for processing, the wafer may contain tens or hundreds of regions to be processed as photodiodes. A typical photodiode area may be approximately 200 µm in diameter, although devices with smaller (e.g. 10 µm) or larger (e.g. 300 µm) dimensions may be fabricated as product requirements demand.

The n-doped InP layer 120 will, when processing is finished, serve as the side of the device where photons will enter the photodetector. Photons with energy below the bandgap of InP (typically ~1.3 eV, corresponding to an infrared wavelength of 954 nm) will pass through this InP layer, but will get absorbed in the InGaAs layer 130 if the energy is higher than the bandgap of this material (as an example, the $In_{0.53}Ga_{0.47}As$ band gap is ~0.75 eV, corresponding to an infrared wavelength of 1650 nm). Although photons with energy below the InGaAs bandgap simply pass through the entire device, this absorption is useful for diode lasers operating in lidar systems and the like having wavelengths around 1550 nm (0.8 eV) range.

The topmost InP layer 140 will be selectively converted to p-doped InP in certain regions, to form an array of micro-cells within the photodiode region 200. As illustrated in FIG. 2B, the location of these regions can be defined by lithographically patterning the dielectric coating layer 150 using standard lithography and etching techniques. This creates apertures 250 in the dielectric coating layer 150 that reveal regions of the InP layer 140, which can then be p-doped to create micro-cells while the dielectric layer 150 protects other areas.

FIG. 3 illustrates a 2-D layout in a hexagonal pattern as may be used in some embodiments for defining micro-cells for p-doping. A typical layout may have circular doping regions with a diameter da, arranged in a hexagonal pattern with a distance $d_{ctr}$ between the centers of nearest-neighbor doping regions. The diameter of the doping regions $d_d$ may typically be approximately 2 to 5 µm, and the distance $d_{ctr}$ between nearest neighbors may typically be approximately 10 µm. This allows a large number of micro-cells to be packed into a circular photodetecting area, which may be have an overall lateral dimension $D_{Lat}$ of approximately 200 µm in diameter.

Although the layout shown in FIG. 3 represents a regular hexagonal array with $d_d$ approximately equal to 80% of $d_{ctr}$ filling a circular region with diameter $D_{Lat}$ approximately 13.5 times $d_{ctr}$ for illustrative purposes, other layouts with different dimensions, or non-circular doping regions, arranged in other configurations such as rectangular arrays, octagonal arrays, or even non-uniform patterns, may be used. Likewise, although particular dimensions have been mentioned and illustrated, other dimensions may be used. The diameter of the doping region da for some designs may be as small as 0.5 μm or as large as 15 μm, while the nearest-neighbor distance between the centers of the doping regions may range from 1 μm to 20 μm, and the overall lateral dimension may range from 10 μm to 300 μm.

As shown in FIG. 4A, p-doping of the InP in the regions exposed by these apertures 250 may be carried out using standard diffusion techniques. The resulting p-doped regions 440 define an avalanche gain region of the micro-cells within the photodiode region 200. In some embodiments, a portion of the InP layer 140 may also remain undoped. The p-doped avalanche gain InP regions 440 are typically formed by diffusing an element such as zinc into the InP, but can be any element that will convert the InP into a p-type semiconductor, such as magnesium, carbon or cadmium.

The next fabrication step, as shown in FIG. 4B, a feedback layer 450 that forms the resistive-capacitive structures for the micro-cells is created. The patterned dielectric layer 150 with apertures 250 is still in place, and so the feedback layer 450 can be deposited onto the p-doped regions 440 using the apertures 250, and functions as the resistive-capacitive element, which, when a charge from an avalanche is flowing through it, reduces the bias in the avalanche region. In some device architectures, the resistor may be placed alongside the photodiode instead of on top of the p-doped region, but this reduces the area used for photodetection, and therefore reduces sensitivity. As disclosed in this process example and in FIG. 4B, the resistive feedback elements 450 are stacked vertically onto the p-doped InP regions 440, and both are defined by the apertures 250 in the dielectric coating layer 150.

Deposition of the resistive layer 450 can be patterned using any number of conventional deposition techniques. The composition and thickness of the resistive layer 450 may vary, with the goal of the combination leading to a reduction of voltage bias across the resistive material of 2 to 3 volts. The resistivity of the layer can be modulated with the inclusion of different concentrations or types of metal into the alloy, such as selenium, antimony, tellurium, and the like.

Although FIGS. 4A and 4B illustrate forming micro-cells using selective p-doping of the InP layer, some illustrative inter-micro-pixel isolation techniques include but are not limited to (i) etching of trenches between the active areas to isolate each of the active areas from adjacent active areas, (ii) etching such isolation trenches and filling them with dielectric material and/or organic material, (iii) etching such trenches and forming separate p-n junctions in the trench region by either ion implantation and/or diffusion and possibly also filling the trenches with dielectric and/or organic material, and (iv) instead of etching such trenches, forming separate p-n junctions in the inter-micro-pixel regions by either implantation and/or diffusion. As will be understood by those skilled in the art, such isolation techniques may be implemented to, for example, absorb (e.g., by providing potential sink) or reflect (e.g., by providing a potential barrier) or recombine (e.g., by providing excess carriers of opposite type) optical and/or electrical carriers that tend to travel to neighboring active area.

In the next step, as illustrated in FIG. 4C, a layer of metallization 460 is deposited to provide electrical contact to the resistive material 450 and the p-doped InP regions of the micro-cells is deposited onto the photodiode region 200. This is typically a patterned deposition, so that the conducting metal, such as gold, is only deposited onto or near to the photodiode region 200. This allows application of a voltage bias to the avalanche photodiode. When a photodetector architecture that sums all micro-cells into a single output is used, the metallization 460 will be a layer of material that makes contact with all the micro-cells, as illustrated, and allows the photocurrent to flow to an anode.

The next step, as illustrated in FIGS. 5A and 5B, creates an n-well in a region near to, but separated from, the photodiode region 200, and provides a means for electrically contacting the n-doped InP layer 120. This allows the n-doped layer 120 to serve as a cathode.

As illustrated in FIG. 5A, the processed wafer of FIG. 4C is patterned to etch a large opening 500 that penetrates through all the layers of a region near to, but not in, the photodiode region 200 of the semiconductor wafer 100 until the n-doped InP layer 120 is contacted. The diameter of the well may typically be circular opening approximately 50 μm in diameter, although some processes may create wells from 10 μm to 100 μm across. Depending on the process conditions used, the well profile may also be smaller at the bottom (e.g. at the n-doped InP layer) than at the top surface of the semiconductor wafer 100, as illustrated in FIG. 5A.

To create the opening 500, first, the opening is defined, typically using a lithographic process. Then, the dielectric layer 150 and the InP layer 140 are removed using a selective chemical etchant (such as HCl: $H_2O_2$). Then, the InGaAsP and InGaAs in the transition layers 135 can be removed using an un-selective chemical etchant (such as Br: $H_2O_2$). The second, un-selective etch may be timed so that etching stops after penetrating the n-doped InP layer.

In the next step, as illustrated in FIG. 5B, a metal deposition step, again typically patterned lithographically, allows portions of the deposited metal to coat a part of the n-well opening 500 to become a metal cathode contact 510.

In the next step of the process, as illustrated in FIG. 6A, the wafer 100 is inverted, and brought into close proximity to a support structure 600. The intention is to bond the flipped photodetector wafer 100 to the support structure 600 using a wafer-on-wafer bonding process. Wafer-on-wafer flip-chip bonding is advantageous because it scales to have one process performed simultaneously on many devices, whereas alternatives, such as wire bonding, are delicate operations and should be performed for each individual device, one at a time. Flip-chip bonding allows all the detectors on the detector wafer to be connected to an equivalent number of support structures simultaneously.

The support structure 600 has electrical connectors 610, 640 patterned lithographically as metal lines on a substrate 601, with the metal connector pattern designed to be mated to the flipped photodetector wafer 100. The patterning may be achieved through a selective metal deposition step, patterned lithographically, or through a general deposition step, with the metal then selectively removed.

The substrate 601 is usually a ceramic material such as alumina or an equivalent. The selection of a ceramic material to be the substrate can have several advantages, including high thermal conductivity, electric isolation, physical strength, low cost, compatibility with processing metal features on the material, and a thermal expansion coefficient that matches InP wafers. Aluminum dioxide ($AlO_2$) and aluminum nitride (AlN) are two ceramic materials that may also be used.

Another alternative material for the substrate 601 is silicon. Single crystal silicon is equivalent or better than the ceramic materials in terms of the thermal expansion coefficient, thermal conductivity, as well as the other parameter mentioned above. But it has an additional advantage: compatibility with microelectronics processing, such as CMOS. For example, a photodiode may need an electronic preamplifier to amplify the signal to levels that are used in electronic circuitry. Such circuits can be pre-fabricated directly onto a silicon wafer used as the support structure, allowing more compact packing with less inter-board wiring used, and improved electric properties, such as impedance matching and low inductance.

A major advantage of using silicon as the substrate is that the silicon wafer can have electronic circuitry already in place, prior to attaching the photodetector chip. The electronic circuit functions are a preamplifier, which can bring the voltage level of the output from the photodetector to one that can be processed in CMOS analog to digital converter, which can also be present. Hence the flip-chip bonded InP photodetector becomes a part of a CMOS Silicon analog-to-digital chip. This combination integration is very advantageous for the performance, cost, size, and functionality of the photodetector, and allows conversion of an analog photodetector to a digital CMOS compatible photoreceiver.

Bonding may be achieved using soft, deformable electrically conducting pads with a low melting point temperature. One group of metal pads 466 may be deposited on the metal contacts 460, 510 of the semiconductor wafer 100. One group of metal pads 666 may be deposited onto metal electrical connectors 610, 640 patterned onto the support structure 600.

Typically the metal used for the bonding pads is indium. However, copper, silver, nickel and gold as well as tin or lead, or other solders, may be used. The metal (indium in this example) is deposited and formed to be a few micrometers thick, and patterned to fit inside the pad. The indium metal pads 466, 666 are often referred to as "bumps", as the aspect ratio of their height vs. width may be low.

In some embodiments, only the support structure 600 is provided with metal contact bumps. In some embodiments, the semiconductor wafer 100 may be provided with metal contact bumps. In some embodiments, both the wafer 100 and the support structure 600 may be provided with metal bumps, as illustrated in FIG. 6A.

Once the indium bumps have been placed, the support and the wafer are attached to each other, as illustrated in FIG. 6B. The attachment may be carried out using a flip-chip bonding machine that has special prism-based optical apparatus to enable alignment of the support and wafer indium bumps. The attachment is performed with heat, pressure and ultrasonic energy, according to bonding processes that are well known in the art.

At the end of this step the photodetector and the support wafer are attached, with merged bumps 566 formed by merging and compressing the wafer bumps 466 and the support bumps 666 together, as illustrated in FIG. 6B.

Since the bumps may be unevenly distributed (only contacting the metal contacts 510, 460 on the wafer), voids may be present everywhere that the bumps were not present. To provide additional strength, an epoxy material 777 may be used to fill the void. This is illustrated in FIG. 7A.

Many epoxy variations may be used to bond the wafer 100 to the support structure 600 and fill the voids, and will be known to those skilled in the art. Desirable characteristics of the epoxy 777 are that the epoxy material has excellent wetting abilities, and can penetrate and surround the merged bumps 566. The epoxy 777 also protects the merged bumps 566, as it surrounds and encapsulates them. It creates a void-filling layer in between the two wafers.

Figure 7B:
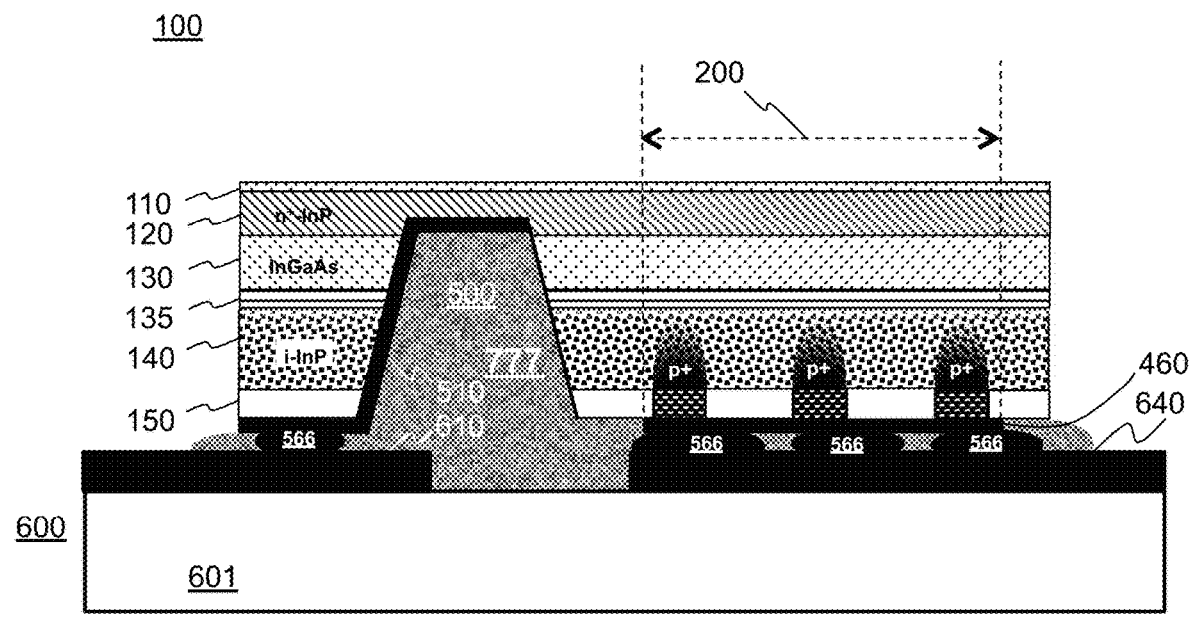
Figure 8A:
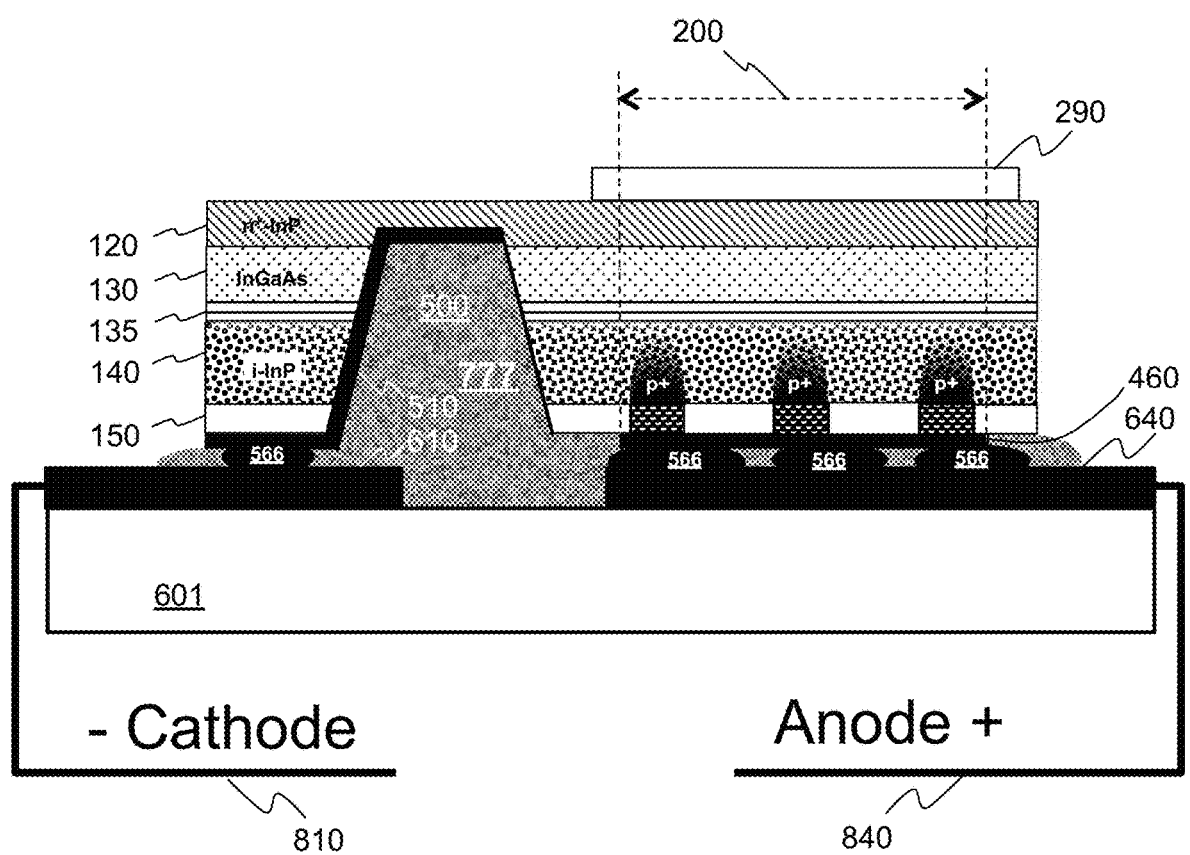
FIGS. 8A-8B illustrate a schematic in cross-section showing electrical connection and photodetection using an avalanche photodiode fabricated according to some embodiments of the invention.
Figure 8B:
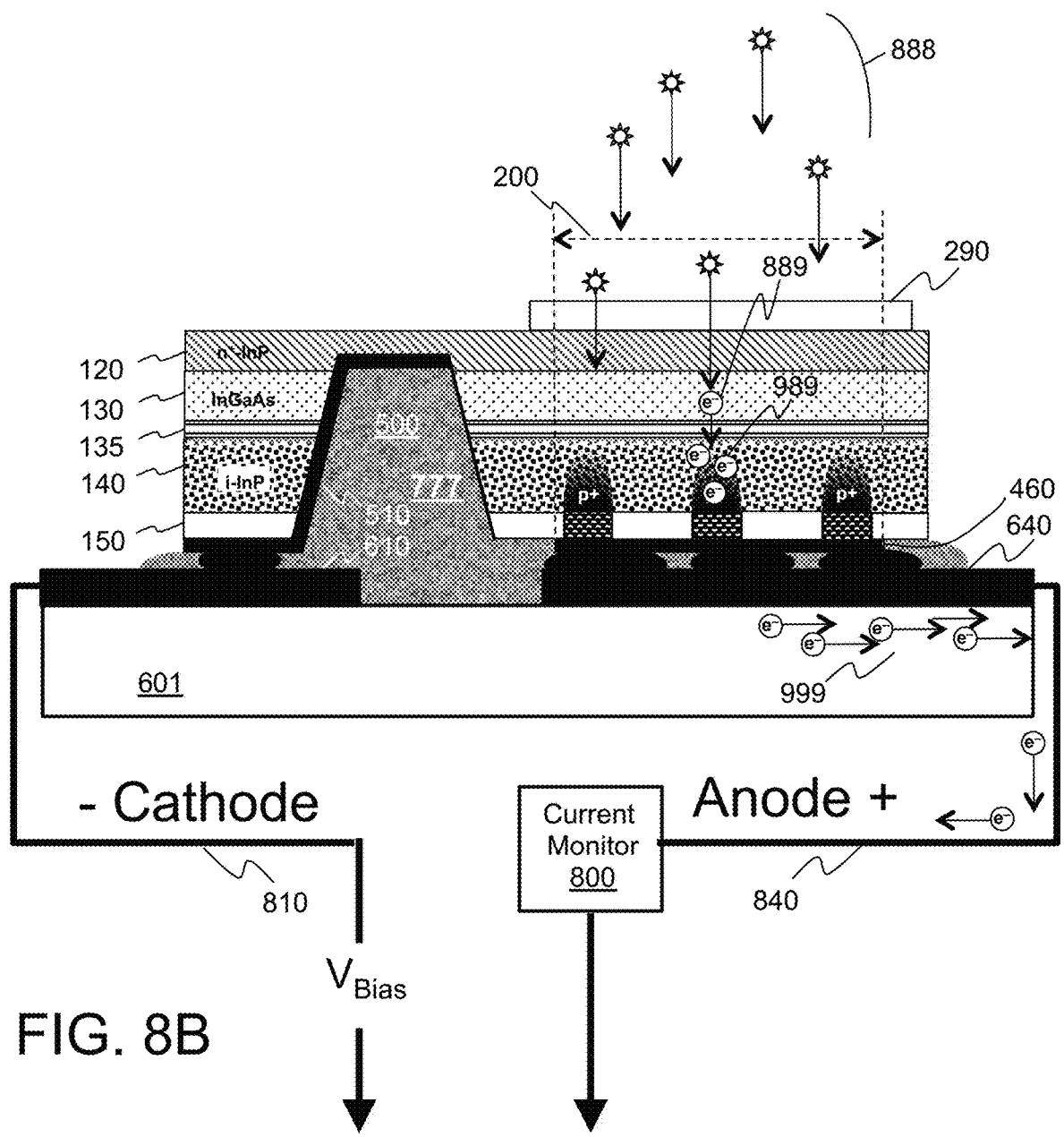

In the next step, as shown in FIG. 7B, the bonded wafers can be processed to thin the backside of the InP wafer 100, removing the InP layer 101 and exposing the photodiode region 200. This can be accomplished using standard etching and wafer thinning processes, with the additional InGaAs layer 110 serving as an etch stop layer.

Figure 7C:
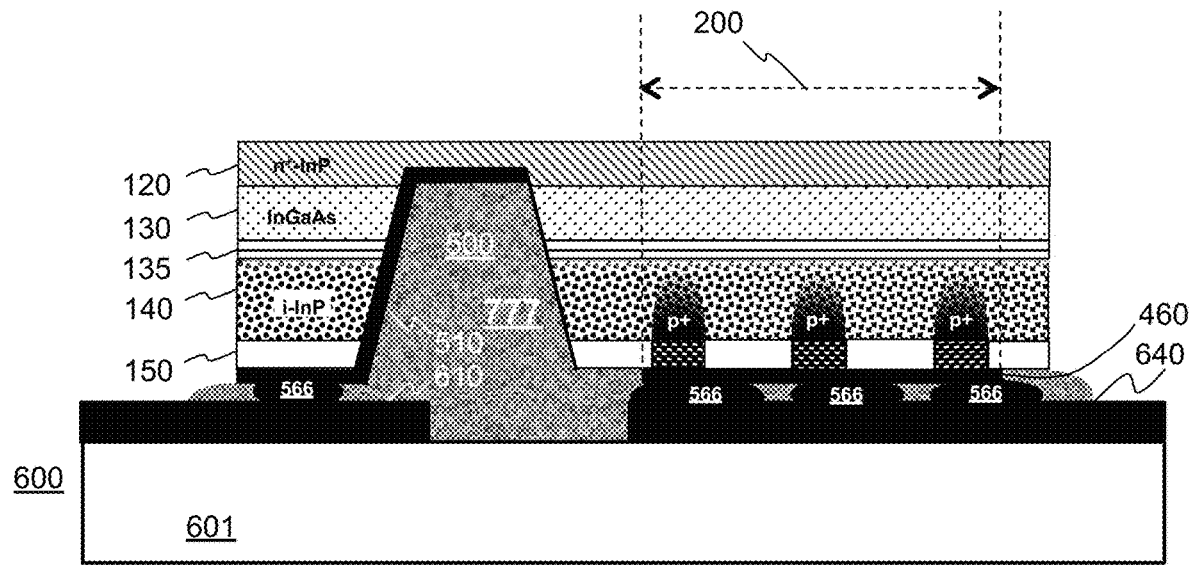

As illustrated in FIG. 7C, Once the bulk of the InP layer 101 has been removed, the InGaAs etch stop layer 110 can be removed by selectively etching using an $H_2O_2$: $H_3PO_4$ based selective InGaAs etchant, which is highly selective for etching InGaAs, but not InP.

There is an added benefit to this InP wafer removal technique: it allows the light to reach the absorbing InGaAs layer 130 with limited free carrier absorption versus conventional InP based back-illuminated photodiodes. Conventional InP based back-illuminated photodiodes use a thinning method to reduce the thickness of the wafer to approximately 100 μm. So, the light passes through approximately 100 μm of n-type doped InP. Usually, the doping level is ~$2 \times 10^{18}$ $cm^{-3}$.

Scattering and other mechanisms limit the wavelength of such a photodetector to be sensitive to the wavelength range of 950 nm to 1650 nm. The longer wavelength in this range is determined by the InGaAs absorbing layer, but the shorter wavelength (~950 nm) is determined by the bandgap of InP and the doping material in it. Thus, in the method presented in this disclosure, incident light must only transit a thin layer of approximately 1 μm of doped n-type InP, while in in the conventional back-illuminated InP photodetector approach, 100 μm thick InP must be traversed. This allows for an increased wavelength responsivity to visible light, with sensitivity to wavelengths as short as approximately 600 nm (~2 eV), which increases the wavelength sensitivity of the photodetector.

Figure 7D:
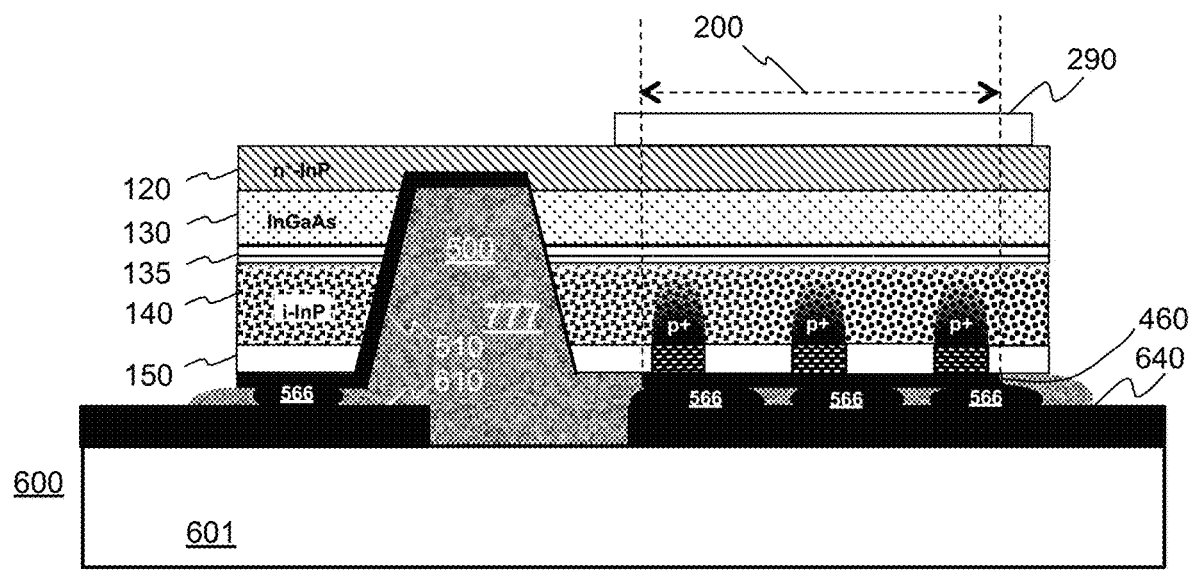

The sensitivity can be further increased for particular wavelength ranges by additionally coating the exposed surface of the photodetector with an anti-reflective layer 290, as also shown in FIG. 7D. This can be selectively applied as illustrated only to the photodiode region(s) 200 with a lithographic patterning step, or as a single coating to the entire device.

As illustrated in FIG. 8A, the final device will be connected to cathode 810 and anode 840 electrodes to provide electrical connections for the photodetector. The cathode 810 is connected through metal connectors 610 on the support structure 600 through the merged bumps 566 to the metal contact 510 to make electrical connection with the n-doped InP layer 120, while the anode 840 is connected through metal connector 640 on the support structure 600 through the bumps 566 to the metal layer 460 in contact with the resistive material 450 that has been deposited onto the p-doped InP regions 440. These electrodes may also be patterned using photolithographic or printed circuit board fabrication processes.

FIG. 8B illustrates the device fabricated in the steps shown in FIGS. 2A-8A being used to detect photons 888. A bias voltage is applied from the cathode 810 through the metal contact 510 in the n-well opening 500 to the n-doped InP layer 120, and across the device to the p-doped InP portions 440 of the micro-cells connected to the anode 840.

The photons 888 enter the photodiode region 200 through the anti-reflective layer 290, pass through the n-doped layer 120, and enter the InGaAs layer 130. In this layer 130, a photon 888 may be absorbed and an electron 889 may be generated. The electron 889 moves towards the anode under the bias field, and encounters the gain region of p-doped InP 440. In this region, additional electrons 989 are generated for each incident electron 889, forming a cascade of electrons 999 that can be measured as a current by a current monitor 800. As long as the photodiode is not saturated, the electron current will be proportional to the number of incident photons.

Figure 9A:
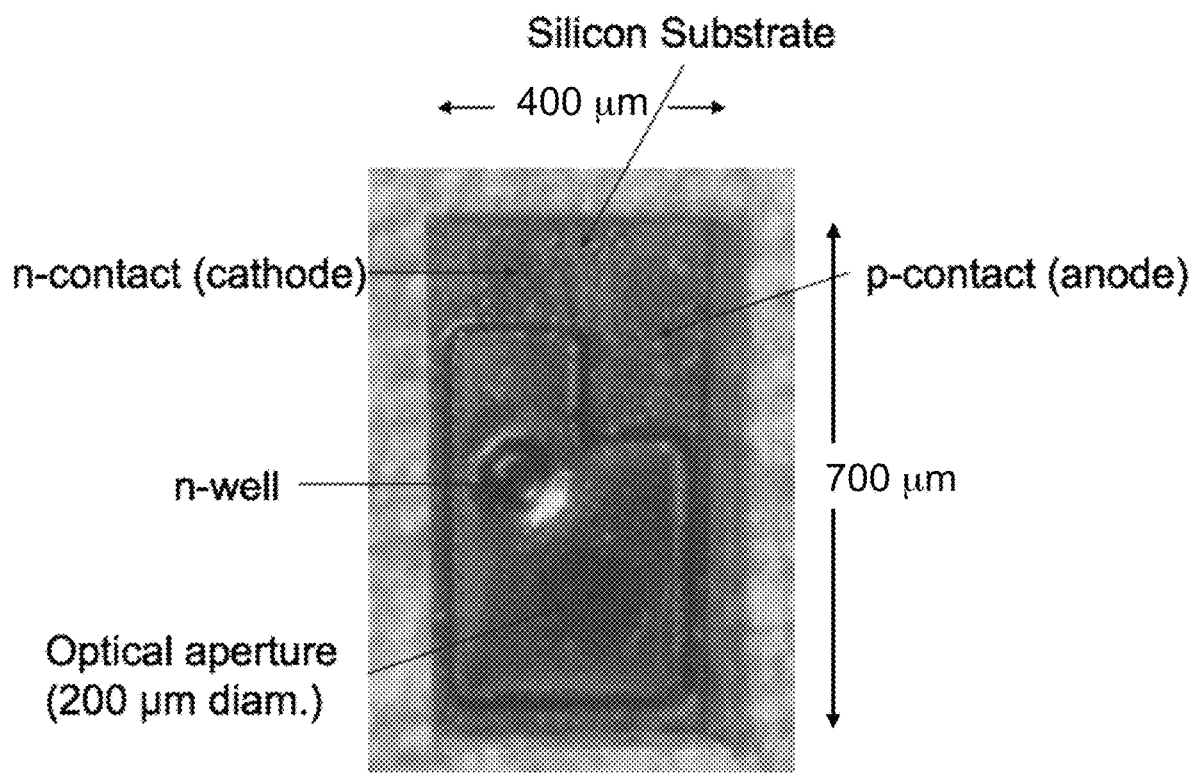
FIG. 9A presents an optical micrograph showing a single avalanche photodetector device fabricated according to an embodiment of the invention.

FIG. 9A illustrates an optical micrograph of a single photodetector device fabricated using the technology disclosed in this Application. The view is from the InP wafer side, with the n-well visible through the ~1 µm thick n-doped InP layer. This corresponds to a device as fabricated in a process such as that illustrated in FIGS. 2A-7D. The device is roughly rectangular in a 2:1 ratio, with outside dimensions of 400 µm by 700 µm, and a circular photosensitive portion approximately 200 µm in diameter. The electrodes are deposited on the silicon substrate, and make contact to the n-well and to the photodetector on the silicon side of the bonded device.

Figure 9B:
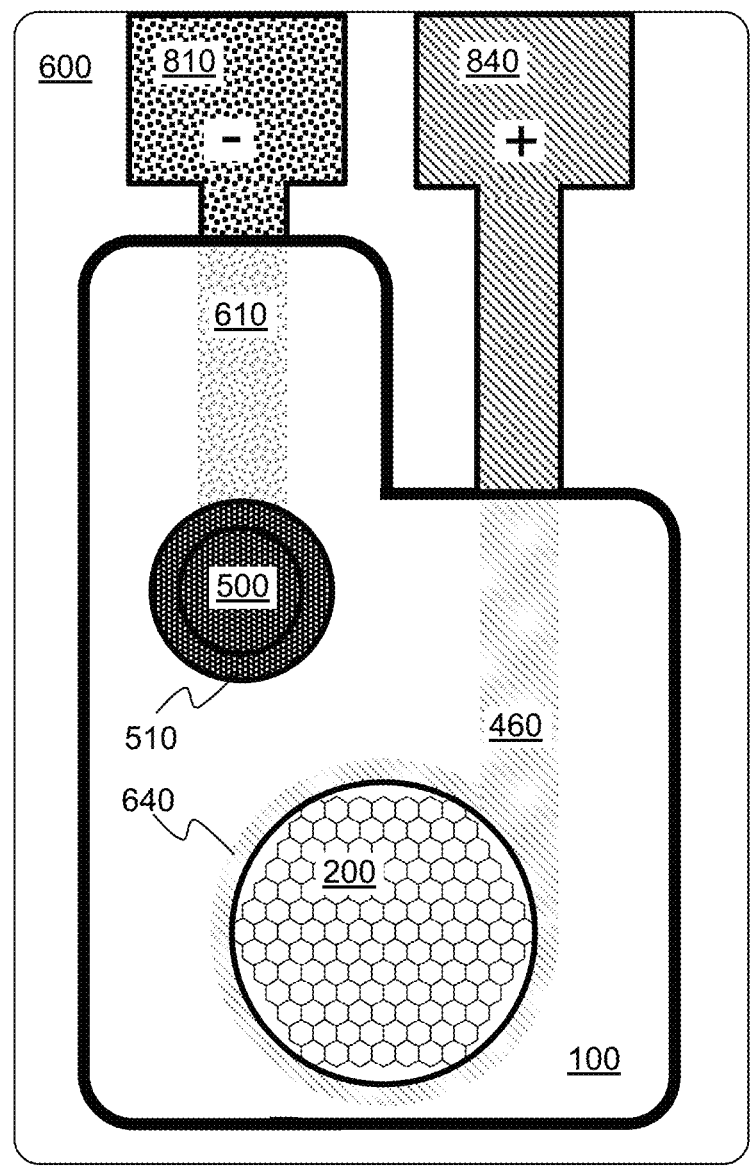
FIG. 9B illustrates a schematic block diagram of the avalanche photodetector device illustrated in FIG. 9A.

FIG. 9B presents a schematic illustration of the device shown in FIG. 9A, with reference numbers corresponding to those used in the descriptions presented in FIGS. 2A-7D.

After the sacrificial InGaAs is removed, there are still a few steps that can be executed to prepare a fully operational device.

The first step is to remove the InP material altogether from the silicon pads, by forming "islands" of InP on top of the Silicon wafer, similarly using selective etching: HCl: $H_2O_2$ for etching InP and $H_2O_2$: $H_3PO_4$ for selective etching of InGaAs.

For the non-selective etch, HBr: $H_2O_2$ is used.

Next, the epoxy is removed from the anode and cathode contacts, using a reactive ion etching (RIE) technique, while protecting the InP "islands" with a protective thick layer of photoresist.

Next, typically coating with dielectric material layers to provide anti-reflection coating is performed. This also serves as an electric passivation layer, hence functioning as a passivation layer on top of the InP material that is not covered with metal.

Additionally, a metal mask may be deposited to provide accurate aperture for photodiode performance This serves to limit light going to the sides, and then through secondary processes generate electron-hole pairs, which diffuse to the active area.

Once these last steps are finalized, still on the wafer scale, the wafer goes through sawing: individual devices are cut away from the bonded wafer/substrate combinations, using a polymer adhesive material such as Mylar, as performed in the conventional CMOS Silicon-wafer sawing process.

III. Photodetector Fabrication Process Flow.

Figure 10:
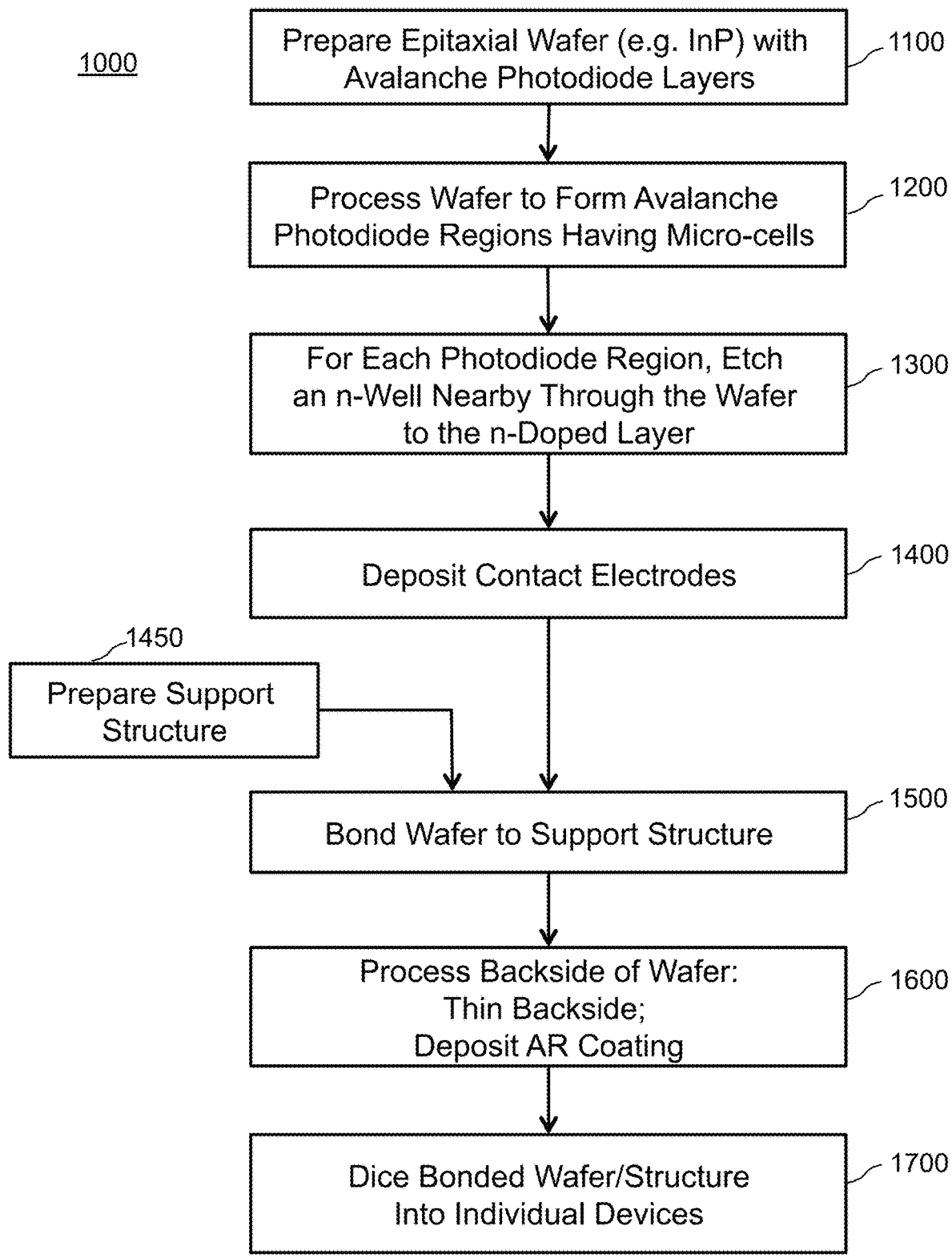
FIG. 10 illustrates a flow chart of process steps according to some embodiments of the invention.

The steps of the process for fabricating an avalanche photodiode device according to some embodiments of the invention can be summarized in the process 1000 illustrated in the flow chart of FIG. 10, and are discussed in more detail below.

In the initial step 1100, the avalanche photodiode wafer is prepared. The wafer may be a 4 inch diameter InP wafer, as discussed above, having a number of layers that may include n-doped InP layers, AlGaAs layers, p-doped InP layers, and metal (e.g. metal carbide) containing resistive layers. The layers may be epitaxially formed onto an InP substrate, and ideally, the epitaxially deposited materials are single crystal layers. In a typical process, the layers are arranged in a stack suitable for the formation of one or more avalanche photodiodes, as illustrated in FIG. 1 and FIGS. 2A-2B.

In the next step 1200, one or more portions of the wafer designated to become avalanche photodiodes are prepared. The preparation may involve dividing the portions into micro-cells, as described above and illustrated in FIG. 3 and FIGS. 4A-4C.

In the next step 1300, for each of the portions of the wafer designated to become avalanche photodiodes, at least one n-well electrical contact is formed to allow connection of the n-doped layer of the avalanche photodiode portion to an external cathode. The preparation may involve etching an n-well cavity into the wafer, as described above and illustrated in FIG. 5A.

In the next step 1400, contact electrodes are formed on a single surface of the wafer using a process such as the patterned deposition of a metal, such as gold. These electrodes provide electrical connections to the n-doped layer through the n-well, and to the p-doped regions, respectively, as described above and illustrated in FIG. 5B.

Meanwhile, after, or in parallel to, the previous steps, in step 1450, a support structure may be prepared. This preparation may involve patterning a substrate of support material, such as a ceramic or silicon wafer, with electrical connectors and circuitry to be bonded to, and used in conjunction with, the avalanche photodiode portions, and prepared with solder "bumps", as described above and illustrated in

FIG. 6A.

In the next step 1500, the photodiode wafer and the support wafer are bonded together and electrically connected, as described above and illustrated in FIG. 6B.

In the next step 1600, the bonded photodiode wafer and support wafer are processed. This preparation may involve filling the voids with epoxy and removing sections of the backside of the photodiode wafer and optionally depositing anti-reflective coatings, as described above and illustrated in FIGS. 7A-7D.

At this stage, in some embodiments, contact electrodes may be formed to allow an anode (connected to the p-doped region) and a cathode (connected through the n-well to the n-doped region) to be connected to the avalanche photodiode(s), allowing a bias voltage to be applied to the device. This may involve deposition of the metal electrodes onto the bonded wafer and substrate combination, as described above and illustrated in FIG. 8A. This step for forming electrical connections may also be performed for individual devices after dicing, described below.

In the next step 1700, the combined wafer and substrate combination are diced to separate all the photodiodes into discrete devices, as described above. If individual electrodes have not yet been attached to the devices, this step is done at this point.

The individual photodetector devices may then be connected to a bias voltage and a current monitor, and used to detect small numbers of photons (or even single photons) and convert them to electrical signals, as described above and illustrated in FIG. 8B.

IV. Process Variations.

With this Application, several embodiments of the invention, including the best mode contemplated by the inventors, have been disclosed. It will be recognized that, while specific embodiments may be presented, elements discussed in detail only for some embodiments may also be applied to others. Such features or combinations are capable of being carried out based on the present specification as a whole in light of the common general knowledge of a person skilled in the art, irrespective of whether such features or combinations of features solve any problems disclosed herein, and without limitation to the scope of the claims. Aspects of the present invention may consist of any such feature or combination of features.

While specific materials, designs, configurations and fabrication steps have been set forth to describe this invention and the preferred embodiments, such descriptions are not intended to be limiting. Modifications and changes may be apparent to those skilled in the art, and it is intended that this invention be limited only by the scope of the appended claims and their equivalents.

What is claimed is:

1. An avalanche photodiode device comprising:
a semiconductor substrate, comprising:
an n-doped InP layer on one side, and
a layer of InGaAs;
a first electrical contact structure that electrically connects through a well formed by etching through the semiconductor substrate to electrically contact the n-doped InP layer;
a deposited layer of undoped InP material,
wherein an array of micro-cells is formed by selectively p-doping circular regions of the layer of undoped InP material by diffusion of at least one dopant into the undoped InP, and wherein centers of the p-doped circular regions formed in the undoped InP layer form a hexagonal pattern;
a hexagonal array of feedback structures formed by deposition of a resistive material onto p-doped circular regions of a plurality of the micro-cells, such that the feedback structures form resistive-capacitive elements that reduce avalanche region bias to be below a breakdown voltage; and
a second electrical contact structure that electrically connects through the feedback structures to p-doped circular regions formed in the undoped InP material,
wherein the second electrical contact structure is electrically separated from the first contact structure.

2. The avalanche photodiode device of claim 1, wherein: the InGaAs is $In_{0.53}Ga_{0.47}As$.

3. The avalanche photodiode device of claim 1, wherein: the circular regions have a diameter that is less than half an average distance between centers of nearest-neighbor doping regions.

4. The avalanche photodiode device of claim 1, wherein: the at least one dopant is selected from the group consisting of: zinc, magnesium, carbon, and cadmium.

5. The avalanche photodiode device of claim 1, wherein: the p-doped circular regions have a diameter from 2 to 5 μm.

6. The avalanche photodiode device of claim 1, wherein: the resistive material is a carbide metal alloy.

7. The avalanche photodiode device of claim 1, wherein: the resistive material contains at least one of: selenium, antimony, tellurium, silicon nitride, silicon carbide, silicon oxide, silicon oxycarbide (SiOC), and silicon oxynitride (SiON).

8. The avalanche photodiode device of claim 1, wherein: when a bias voltage is applied between the first electrical contact structure and the second electrical contact structure,
portions of the InP layer function as an avalanche gain region, and
the feedback structures reduce voltage across the avalanche gain region when electrons move from the InGaAs layer through the p-doped regions towards the second electrical contact structure.

9. The avalanche photodiode device of claim 1, additionally comprising:
a dielectric layer between the layer of InP material and the second electrical contact structure.

10. The avalanche photodiode device of claim 9, wherein: the dielectric layer comprises silicon nitride.

11. The avalanche photodiode device of claim 9, wherein: the p-doped circular regions are defined using apertures formed in the dielectric layer, and
the resistive material of the feedback structures is deposited into said apertures.

12. The avalanche photodiode device of claim 1, wherein: the micro-cells have a spacing between centers from 1 to 15 micrometers; and
the array of micro-cells has lateral dimension between 10 and 300 micrometers.

13. The avalanche photodiode device of claim 1, additionally comprising:
an anti-reflection coating on a portion of the n-doped InP layer.

14. The avalanche photodiode device of claim 1, additionally comprising:
a transition layer between the layer of InGaAs and a layer of InP material, comprising InGaAsP.

15. The avalanche photodiode device of claim 1, additionally comprising:
a support structure comprising a substrate with at least one side, and at least two electrically separated electrical connectors on said side, and
wherein the electrical connectors are positioned to make electrical contact with the first electrical contact structure and the second electrical contact structure.

16. The avalanche photodiode device of claim 15, wherein
the substrate of the support structure comprises at least one of: alumina ($Al_2O_3$), aluminum dioxide ($AlO_2$), aluminum nitride (AlN), and silicon.

17. The avalanche photodiode device of claim 16, wherein
the substrate of the support structure comprises silicon, and
the support structure additionally comprises pre-fabricated electronic circuits.

18. An avalanche photodiode device, the photodiode device comprising:
a semiconductor substrate, comprising:
an n-doped InP layer on one side,
a layer of InGaAs;
a first electrical contact structure that electrically connects to the n-doped InP layer;
a deposited layer of undoped InP material,
wherein an array of micro-cells is formed by selectively p-doping circular regions of the layer of undoped InP material by diffusion of at least one dopant into the undoped InP, and, wherein centers of the p-doped circular regions in the undoped InP layer form a hexagonal pattern;
a hexagonal array of feedback structures formed by deposition of a resistive material onto p-doped circular regions of a plurality of the micro-cells, such that the feedback structures form resistive-capacitive elements that reduce avalanche region bias to be below a breakdown voltage; and a second electrical contact structure that electrically connects through the resistive-capacitive structures to the p-doped circular regions formed in the undoped InP material,
   wherein the second electrical contact structure is electrically separated from the first contact structure.

19. The avalanche photodiode device of claim 18, wherein:
   when a bias voltage is applied between the first electrical contact structure and the second electrical contact structure, portions of the InP layer function as an avalanche gain region, and
   the feedback structures reduce voltage across the avalanche gain region when electrons move from the InGaAs layer through the p-doped regions towards the second electrical contact structure.

20. The avalanche photodiode device of claim 18, additionally comprising:
   a dielectric layer between the layer of InP material and the second electrical contact structure;
   and wherein:
   the p-doped regions are defined using apertures formed in the dielectric layer, and
   the resistive material of the feedback structures is deposited into said apertures.

* * * * *